(12) United States Patent
Jao

(10) Patent No.: US 7,518,211 B2
(45) Date of Patent: Apr. 14, 2009

(54) CHIP AND PACKAGE STRUCTURE

(75) Inventor: Jui-Meng Jao, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 80 days.

(21) Appl. No.: 11/164,135

(22) Filed: Nov. 11, 2005

(65) Prior Publication Data

US 2007/0108623 A1 May 17, 2007

(51) Int. Cl.
*H01L 27/082* (2006.01)
*H01L 29/40* (2006.01)

(52) U.S. Cl. .................. 257/529; 257/773; 257/786; 257/E23.149

(58) Field of Classification Search .............. 257/529, 257/778, 773, 786, 758, E23.149
See application file for complete search history.

(56) References Cited

U.S. PATENT DOCUMENTS 4,761,386 A * 8/1988 Buynoski ............... 438/15
5,844,317 A * 12/1998 Bertolet et al. ........... 257/773
6,020,561 A * 2/2000 Ishida et al. ............. 174/261
6,656,826 B2 * 12/2003 Ishimaru ................ 438/612
6,724,091 B1 * 4/2004 Jayaraman et al. ........ 257/778
6,943,059 B2 * 9/2005 Maeda .................. 438/108
7,176,572 B2 * 2/2007 Hanaoka ................ 257/758

FOREIGN PATENT DOCUMENTS

CN              1399334         2/2003

* cited by examiner

*Primary Examiner*—Nitin Parekh
(74) *Attorney, Agent, or Firm*—Jianq Chyun IP Office

(57) ABSTRACT

The invention is directed to a chip comprising a substrate having a plurality of pads located thereon and a passivation layer located over the substrate, wherein the passivation layer has a plurality of openings and recesses formed therein and the openings expose the pads respectively. During the later performed packaging process, a molding compound can fill out the recesses on the passivation layer to provide a stronger mechanical adhesion between the molding compound and the passivation layer. Therefore, the peeling issue of the molding compound can be solved.

17 Claims, 2 Drawing Sheets

CHIP AND PACKAGE STRUCTURE

BACKGROUND OF THE INVENTION

1. Field of Invention

The present invention relates to a chip and a package structure of the chip. More particularly, the present invention relates to a technology to detection of a chip and a package structure with several recesses formed on the chip surface.

2. Description of Related Art

Currently, with the improvement and the development of the technique for manufacturing semiconductor devices, the high performance electronic merchandises are rapidly produced and developed. Also, the functionality of the electronic merchandises becomes more and more human-like and multi-functional. In one electronic merchandise, there are several integrated circuits manipulating different operations respectively. In the process for manufacturing an electronic device, integrated circuit package plays an important role. There are many types of integrated circuit package include pin-in-hole type and surface-mount-technology. The pin-in-hole type package can be a dual-in-line package or a pin-grid array. The surface-mount package can be a wire bonding package, tape automatic bonding package, flip chip package or ball grid array package.

However, there are some problems for packaging a chip while the chip size is increased. During the chip with a relatively large chip size is packed, because the stress between the chip and the molding compound is not even, the molding compound or so called underfill is easily peeling which leads to the exposure or delamination of a portion of the chip. Currently, the solution for the peeling problem mentioned above is to adjust the composition of the molding compound or so called underfill to increase the adhesion between the molding compound and the passivation layer of the chip.

The adhesion mentioned above depends on the resin composition of the molding compound. Therefore, adjusting the resin composition can be a way to increase the adhesion between heterogeneous materials. However, changing the composition of the molding compound could leads to the increasing of the stress and other unexpected issues.

SUMMARY OF THE INVENTION

Accordingly, at least one objective of the present invention is to provide a chip capable of increasing the adhesion between the chip and the molding compound.

At least another objective of the present invention is to provide a package structure which can prevent the chip from being exposed due to the molding compound or so called underfill peeling away from the chip.

To achieve these and other advantages and in accordance with the purpose of the invention, as embodied and broadly described herein, the invention provides a chip comprising a substrate having a plurality of pads located thereon and a passivation layer located over the substrate, wherein the passivation layer has a plurality of openings and recesses formed therein and the openings expose the pads respectively.

In the present invention, a topmost layer of the passivation layer includes a polymer layer and the polymer layer is made of a material selected from a group consisting of polyimide, silicon nitride, silicon oxide and benzocyclobutene. Moreover, the openings and the recesses are formed simultaneously. The depth of the recesses is larger than 1000 angstroms and the width of the recesses is larger than 5000 angstroms. Also, the substrate possesses a fuse region and a non-fuse region and the recesses are located in the non-fuse region and the recesses are not located in a portion of the passivation layer over the pads.

The present invention also provides a package structure. The package structure comprises a chip, a carrier, several conductive connecting means and a molding compound. The chip has several pads and a passivation layer covering the pads, wherein the passivation layer has several openings and recesses and the openings expose the pads respectively. The carrier has several connecting ends. The onductive connecting means electrically connect the pads and the connecting ends respectively. The molding compound covers the pads, the connecting ends and the conductive connecting means, wherein the molding compound fills out the recesses.

In the present invention, the molding compound is made of epoxy molding compound. Furthermore, the conductive connecting means include bumps and connecting wires. Moreover, a topmost layer of the passivation layer includes a polymer layer and the polymer layer is made of a material selected from a group consisting of polyimide, silicon nitride, silicon oxide and benzocyclobutene. Further, the openings and the recesses are formed simultaneously. The depth of the recesses is larger than 1000 angstroms and the width of the recesses is lager than 5000 angstroms. Also, the substrate possesses a fuse region and a non-fuse region and the recesses are located in the non-fuse region and the recesses are not located in a portion of the passivation layer over the pads.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
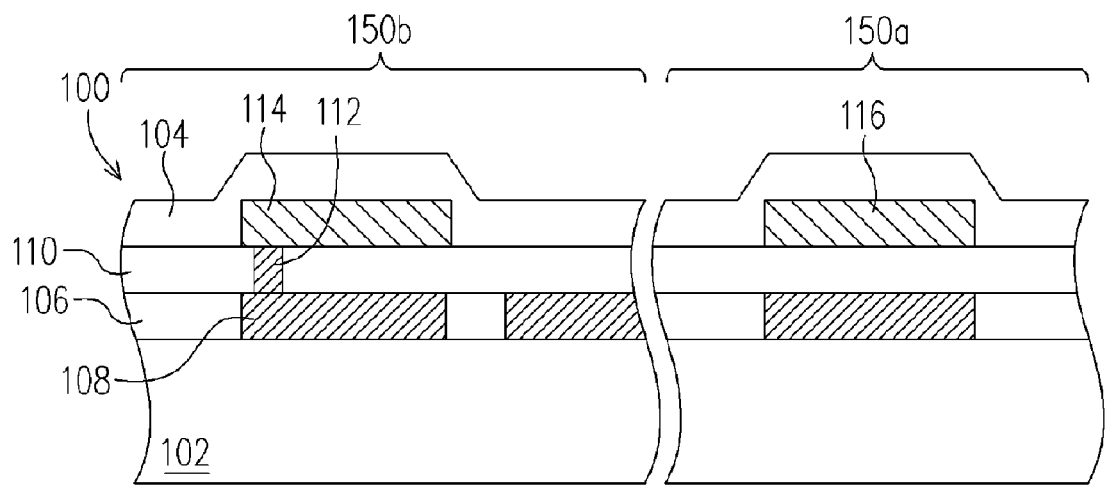
FIGS. 1 through 2 are cross-sectional views showing a method for manufacturing a chip according to one preferred embodiment of the present invention.
Figure 2:
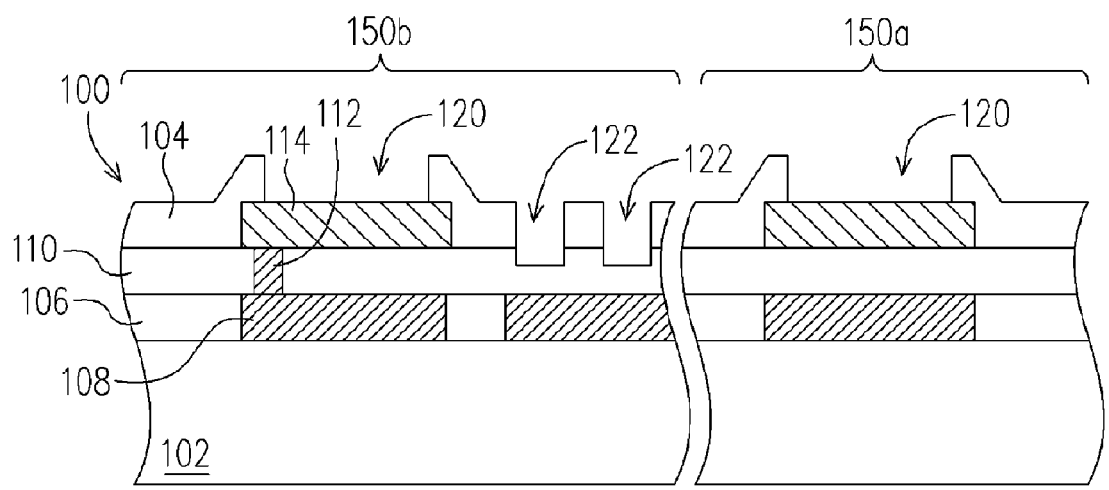

FIGS. 1 through 2 are cross-sectional views showing a method for manufacturing a chip according to one preferred embodiment of the present invention. As shown in FIG. 1, a chip 100 is provided. The chip 100 possesses a substrate 102 and a passivation layer 104 located over the substrate 102. To simplify the description of the invention, only a portion of the substrate 102 is drawn in FIGS. 1 and 2. On the substrate 102, there are a dielectric layer 106, a metal layer 108, a dielectric layer 110, a via 112, a pad 114 and a fuse 116. The dielectric layer 106 can be, for example but not limited to, made of silicon oxide. The metal layer 108 is located in the dielectric layer 106. The metal layer 108 can be, for example but not limited to, an interconnect structure and can be formed from aluminum or copper, for example. The dielectric layer 110 is located over the dielectric layer 106 and can be, for example but not limited to, made of silicon oxide. The via 112 is located in the dielectric layer 110 and is electrically connected to the metal layer 108. The via 112 can be, for example but not limited to, a plug of the interconnect structure. Furthermore, the via can be, for example but not limited to, made of tungsten. Moreover, the pad 114 is located on the dielectric layer 110 and is electrically connected to the via 112. The pad can be, for example but not limited to, made of aluminum, copper or aluminum alloy.

In this embodiment, the chip 100 is divided into a fuse region 150a and a non-fuse region 150b. As shown in FIG. 1, the fuse 116 is located in the fuse region 150a.

The passivation layer 104 is located over the dielectric layer 110. The passivation layer 104 can be, for example but not limited to, made of silicon nitride, silicon oxide, silicon oxy-nitride or phosphorous silicon glass. A topmost layer of the passivation layer 104 can be a polymer layer (not shown). The polymer layer can be, for example but not limited to, made of polyimide, silicon nitride, silicon oxide or benzocyclobutene. The passivation layer 104 can prevent the metal layer 108 under the passivation layer 104 from being damaged by the mobile ions, moisture, transition metal and any other impurities.

As shown in FIG. 2, several openings 120 and recesses 122 are formed in the passivation layer 104. The openings 120 and the recesses 122 can be formed simultaneously. The method for forming openings 120 and the recesses 122 comprises a step of performing a photolithography-and-etching process on the chip 100. The openings 120 expose the pad 114 and the fuse 116 respectively. The depth of the recesses 122 is larger than 1000 angstroms and the width of the recesses 122 is lager than 5000 angstroms. To prevent the pad 114 and the fuse 116 from being damaged, the location of the recesses 122 is limited. Preferably, the recesses 122 are located in a portion of the passivation layer 104 at non-fuse region 150b. Moreover, the recesses 122 are not located in a portion of the passivation layer 104 over the pads 114.

The chip 100 in the aforementioned embodiment is an example for illustrating the present invention. However, the aforementioned method and chip structure do not limit the scope and breadth of the present invention for further being applied in the real application.

In the invention, there are several recesses located in the passivation layer over the chip. In the later performed process, the molding compound can fill out the recesses so that the adhesion between the molding compound and the passivation layer is increased. Hence, the peeling problem of the molding compound due to uneven stress and poor adhesion between heterogeneous materials can be solved. Further, the chip can be prevented from being exposed by the peeling molding compound.

Hereafter, a package structure for a chip with the recesses according to one preferred embodiment of the present invention is illustrated. To simplify the description, the chip 100 is a part of the package structure and the similar labeled numbers are directed to the same element shown in FIGS. 1 and 2.

Figure 3:
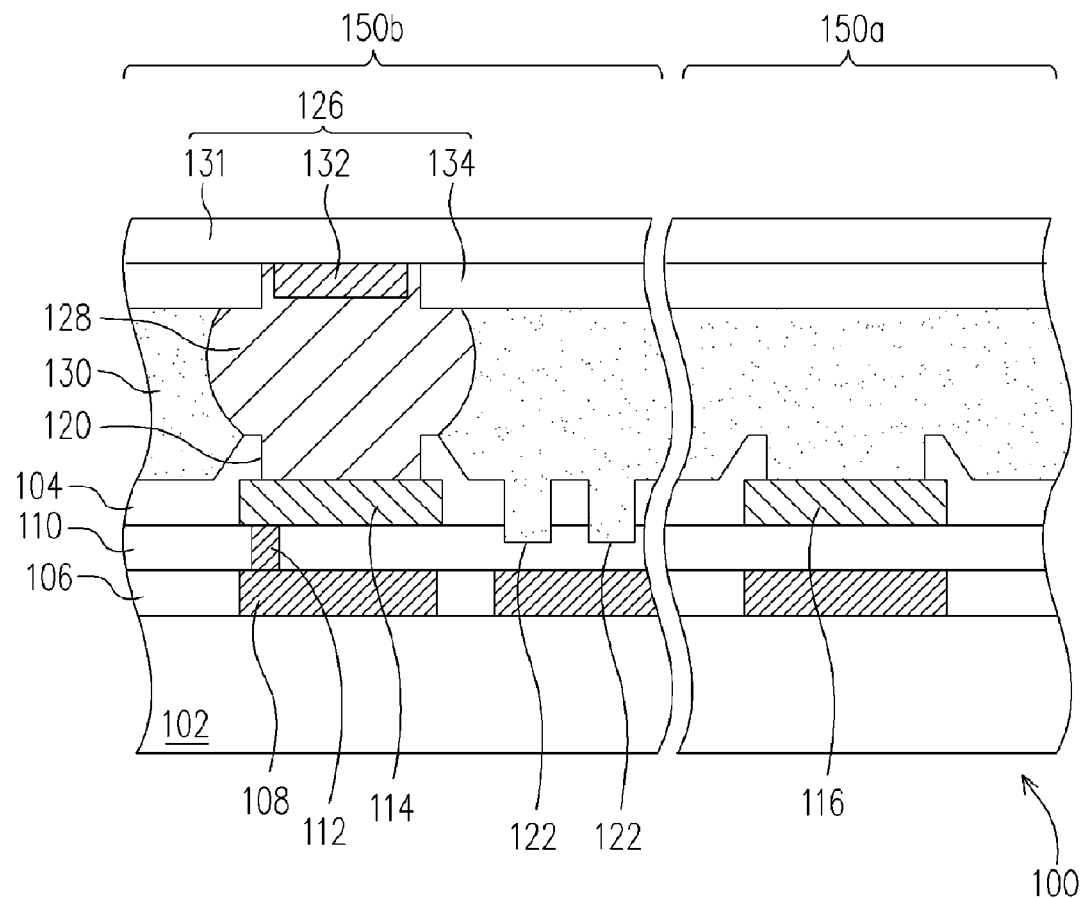
FIG. 3 is a cross-sectional view illustrating a flip chip package structure according to one preferred embodiment of the present invention.

FIG. 3 is a cross-sectional view illustrating a flip chip package structure according to one preferred embodiment of the present invention. As shown in FIG. 3, a package structure is composed of a chip 100, a carrier 126, several conductive connecting means 128 and a molding compound 130. The chip 100 possesses a substrate 102 and a passivation layer 104 located over the substrate 102. Between the substrate 102 and the passivation layer 104, there are a dielectric layer 106, a metal layer 108, a dielectric layer 110, a via 112, a pad 114 and a fuse 116. The metal layer 108 is located in the dielectric layer 106. The dielectric layer 110 is located over the dielectric layer 106. The via 112 is located in the dielectric layer 110 and is electrically connected to the metal layer 108. Moreover, the pad 114 and the fuse 116 are located on the dielectric layer 110, wherein the pad 114 is electrically connected to the via 112.

The passivation layer 104 is located over the dielectric layer 110. The passivation layer 104 can be, for example but not limited to, made of silicon nitride, silicon oxide, silicon oxy-nitride or phosphorous silicon glass. A topmost layer of the passivation layer 104 can be a polymer layer (not shown). The polymer layer can be, for example but not limited to, made of polyimide, silicon nitride, silicon oxide or benzocyclobutene. The passivation layer 104 possesses several recesses 122 and several openings 120, wherein the openings 120 expose the pad 114 and the fuse 116 respectively. The openings 120 and the recesses 122 can be formed simultaneously. he depth of the recesses 122 is larger than 1000 angstroms and the width of the recesses 122 is lager than 5000 angstroms. To prevent the pad 114 and the fuse 116 from being damaged, the location of the recesses 122 is limited. Preferably, the recesses 122 are located in a portion of the passivation layer 104 at non-fuse region 150b. Moreover, the recesses 122 are not located in a portion of the passivation layer 104 over the pads 114.

The carrier 126 can be, for example but not limited to, composed of a substrate 131, several connecting ends 132 and solder mask 134. The pads 114 are electrically connected to the connecting ends 132 through the conductive connecting means 128 respectively. In the present embodiment, the conductive connecting means 128 can be, for example but not limited to, solder bumps. The solder bumps can be, for example but not limited to, made of gold, tin or other conductive material. The molding compound 130 covers the pads 114, the connecting ends 132 and the conductive connecting means 128. More specifically, the molding compound 130, the so called underfill, fills out the recesses 122 to provide a relatively stronger mechanical adhesion between the molding compound 130 and the passivation layer 104. The molding compound 130 can be, for example but not limited to, made of epoxy molding compound or other plastic material with low-moisture absorption and high resistance against to the erosion.

Figure 4:
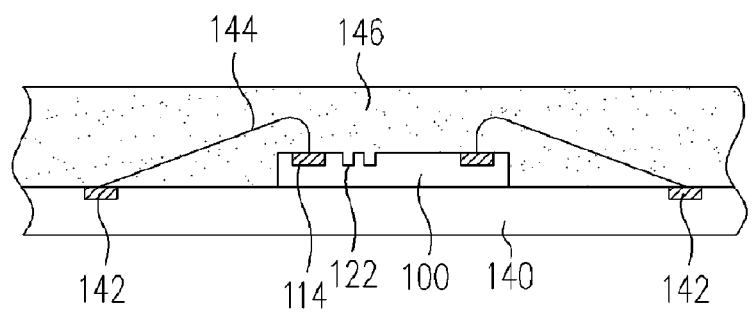
FIG. 4 is a cross-sectional view illustrating a wire bonding package structure according to another preferred embodiment of the present invention.

In the aforementioned embodiment, a flip chip package is used as an example for illustrating the present invention. However, the present invention is not limited by the flip chip package only. The chip 100 with several recess 122 can be applied to other types of package, such as wire bonding package. FIG. 4 is a cross-sectional view illustrating a wire bonding package structure according to another preferred embodiment of the present invention. To simplify the description, the chip 100 is a part of the package structure and the similar labeled numbers are directed to the same element shown in FIGS. 1 and 2. As shown in FIG. 4, the wire bonding package structure comprises a carrier 140 having several connecting ends 142, a chip 100 located on the carrier 140, several conductive connecting means 144 and a molding compound 146. In the wire bonding package structure, the conductive connecting means 144 are metal wires and the carrier 140 can be, for example but not limited to, a leadframe. The connecting ends 142 are electrically connected to the pads 114 through the conductive connecting means 144 respectively. The molding compound 146 covers the pads 114, the connecting ends 142 and the conductive connecting means 144. Also, the molding compound 146 fills out the recesses 122 to provide a relatively stronger mechanical adhesion between the molding compound 146 and the passivation layer 104.

In the present invention, there are several recesses on the passivation layer so that the molding compound can fill out the recesses during the packaging process. Hence, the mechanical adhesion between the molding compound and the chip is increased so that the peeling issue due to uneven stress between heterogeneous materials can be solved. Therefore, the packed chip can be prevented from being exposed and the reliability of the devices formed on the chip is increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A chip comprising:
   a substrate having an underlayer and a plurality of pads located on the underlayer;
   a passivation layer located on the underlayer, wherein the passivation layer has a plurality of openings and recesses formed therein and the openings expose the pads respectively, and a bottom of the recesses exposing the underlayer and wherein the substrate possesses a fuse region and a non-fuse region and the recesses are located in the non-fuse region.

2. The chip of claim 1, wherein a topmost layer of the passivation layer includes a polymer layer.

3. The chip of claim 2, wherein the polymer layer is made of a material selected from a group consisting of polyimide, silicon nitride, silicon oxide and benzocyclobutene.

4. The chip of claim 1, wherein the openings and the recesses are formed simultaneously.

5. The chip of claim 1, wherein the depth of the recesses is larger than 1000 angstroms.

6. The chip of claim 1, wherein the width of the recesses is larger than 5000 angstroms.

7. The chip of claim 1, wherein the recesses are not located in a portion of the passivation layer over the pads.

8. A package structure comprising:
   a chip having an underlayer, a plurality of pads on the underlayer and a passivation layer covering the pads, wherein the passivation layer has a plurality of openings and recesses and the openings expose the pads respectively and a bottom of the recesses exposing the underlayer;
   a carrier having a plurality of connecting ends;
   a plurality of conductive connecting means, wherein the conductive connecting means electrically connect the pads and the connecting ends respectively;
   a molding compound covering the pads, the connecting ends and the conductive connecting means, wherein the molding compound fills out the recesses and wherein the substrate possesses a fuse region and a non-fuse region and the recesses are located in the non-fuse region.

9. The package structure of claim 8, wherein the molding compound is made of epoxy molding compound.

10. The package structure of claim 8, wherein the conductive connecting means include bumps.

11. The package structure of claim 8, wherein the conductive connecting means includes connecting wires.

12. The package structure of claim 8, wherein a topmost layer of the passivation layer includes a polymer layer.

13. The package structure of claim 12, wherein the polymer layer is made of a material selected from a group consisting of polyimide, silicon nitride, silicon oxide and benzocyclobutene.

14. The package structure of claim 8, wherein the openings and the recesses are formed simultaneously.

15. The package structure of claim 8, wherein the depth of the recesses is larger than 1000 angstroms.

16. The package structure of claim 8, wherein the width of the recesses is larger than 5000 angstroms.

17. The package structure of claim 8, wherein the recesses are not located in a portion of the passivation layer over the pads.

* * * * *